(12) United States Patent
Arisumi et al.

(10) Patent No.: US 8,766,350 B2
(45) Date of Patent: Jul. 1, 2014

(54) SEMICONDUCTOR DEVICE AND METHOD FOR FABRICATING SEMICONDUCTOR DEVICE

(75) Inventors: Osamu Arisumi, Mie (JP); Toshihiko Iinuma, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/586,167

(22) Filed: Aug. 15, 2012

(65) Prior Publication Data

US 2013/0240969 A1 Sep. 19, 2013

(30) Foreign Application Priority Data

Mar. 19, 2012 (JP) ................. 2012-062436

(51) Int. Cl.
*H01L 29/788* (2006.01)
(52) U.S. Cl.
USPC .......... 257/315; 257/316; 257/E29.3
(58) Field of Classification Search
USPC .............. 257/315, 316, E21.209, E29.3; 438/257, 591
See application file for complete search history.

(56) References Cited

U.S. PATENT DOCUMENTS

| 6,406,975 | B1 | 6/2002 | Lim et al. | |
|---|---|---|---|---|
| 8,193,058 | B2 * | 6/2012 | Ide et al. | 438/261 |
| 2008/0102579 | A1 | 5/2008 | Dong et al. | |
| 2008/0246075 | A1 * | 10/2008 | Matsuno | 257/316 |
| 2010/0093143 | A1 * | 4/2010 | Ide et al. | 438/261 |
| 2010/0304549 | A1 | 12/2010 | Dong et al. | |
| 2012/0070976 | A1 * | 3/2012 | Kim et al. | 438/594 |

FOREIGN PATENT DOCUMENTS

| JP | 2002-203896 | 7/2002 |
|---|---|---|
| JP | 2007-250656 | 9/2007 |
| JP | 2008-118084 | 5/2008 |
| JP | 2009-267208 | 11/2009 |
| JP | 2010-87160 | 4/2010 |

OTHER PUBLICATIONS

Partial machine translation of JP 2009-267208 published Dec. 2009.*

* cited by examiner

*Primary Examiner* — Tuan N. Quach
(74) *Attorney, Agent, or Firm* — Oblon, Spivak, McClelland, Maier & Neustadt, L.L.P.

(57) ABSTRACT

A semiconductor device according to an embodiment, includes a plurality of gate structures; a first dielectric film; and a second dielectric film. The first dielectric film crosslinks adjacent gate structures of the plurality of gate structures so as to form a cavity each above and below in a position between the adjacent gate structures. The second dielectric film is formed as if to cover the cavity above the first dielectric film between the adjacent gate structures.

11 Claims, 15 Drawing Sheets

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from Japanese Patent Application No. 2012-062436 filed on Mar. 19, 2012 in Japan, the entire contents of which are incorporated herein by reference.

FIELD

Embodiments described herein relate generally to a semiconductor device and method for fabricating a semiconductor device.

BACKGROUND

In development of a semiconductor device, particularly a semiconductor storage device, ever finer patterning is developed for memory cells to achieve larger capacities and lower costs. In a semiconductor storage device mounted with a floating gate structure such as a NAND flash memory device, the wire pitch between word lines to be a control gate in a gate portion is made ever finer. Such finer patterning of LSIs is actively promoted to achieve performance improvement such as a faster operation and lower power consumption of elements due to higher integration and the reduction in manufacturing costs. In recent years, flash memories in minimum processing dimensions of, for example, 20 nm or so have been in mass production and still finer patterning and increasing technical difficulty are expected in the future. To realize a high-quality, high-performance, and low-cost semiconductor device in the face of rapid development of ever finer patterning, it is necessary to further reduce the parasitic capacitance between gate structures. In a next-generation flash memory device, both the cell width and the width between cells are extremely narrow due to still finer patterning and a technology to provide a cavity region is under development, instead of embedding a dielectric film between gate structures in a memory cell region, to inhibit electric interference between cells. By intentionally forming a cavity instead of the dielectric film embedded between gate structures in the memory cell region, a parasitic capacitance generated between gate structures can be reduced so that performance of a memory device can be improved.

However, if a cavity is formed between gate structures, mechanical strength of the gate structure is extremely weakened and with the development of ever finer patterning of devices, a problem of cracks in the dielectric film deposited in the memory cell region and a problem of a toppling gate structure in the memory cell portion are caused.

DETAILED DESCRIPTION

A semiconductor device according to an embodiment, includes a plurality of gate structures; a first dielectric film; and a second dielectric film.

The first dielectric film crosslinks adjacent gate structures of the plurality of gate structures so as to form a cavity each above and below in a position between the adjacent gate structures. The second dielectric film is formed as if to cover the cavity above the first dielectric film between the adjacent gate structures.

A method for fabricating a semiconductor device according to an embodiment, includes forming a sacrificial film up to an intermediate height position between a plurality of gate structures formed above a semiconductor substrate; forming a first dielectric film above the sacrificial film; forming a second dielectric film above the plurality of gate structures so as to leave a cavity between the plurality of gate structures above the first dielectric film; and removing the sacrificial film after the first dielectric film is formed.

A method for fabricating a semiconductor device according to an embodiment, includes forming a sacrificial film up to an intermediate height position between a plurality of gate structures formed above a semiconductor substrate; forming a first dielectric film above the sacrificial film; removing the sacrificial film after the first dielectric film is formed; etching the first dielectric film up to an another intermediate height position between the plurality of gate structures after the sacrificial film is removed; and forming a second dielectric film above the plurality of gate structures so as to leave a cavity between the plurality of gate structures and above the first dielectric film after the first dielectric film is etched.

First Embodiment

In the first embodiment, the method for fabricating a nonvolatile NAND flash memory device as an example of the semiconductor device will be described. The method for fabricating a semiconductor device described below is not limited to a NAND flash memory device and is also effective to other semiconductor devices (memory devices) in which a plurality of gate structures is arranged and semiconductor devices other than memory devices. The first embodiment will be described below using drawings.

Figure 1:
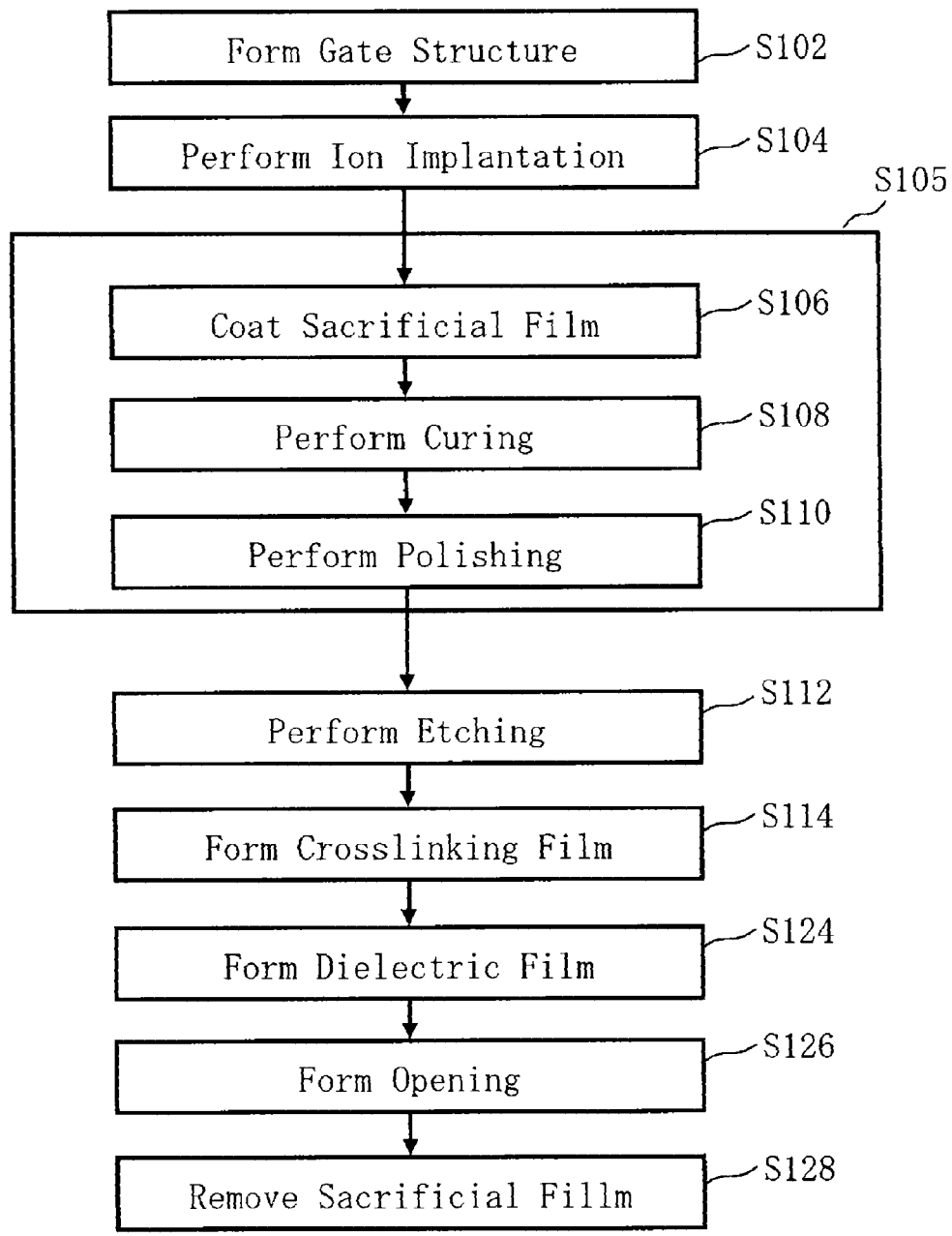
FIG. 1 is a flow chart showing principal processes of a method for fabricating a semiconductor device according to a first embodiment.

FIG. 1 is a flow chart showing principal processes of a method for fabricating a semiconductor device according to the first embodiment. In FIG. 1, the method for fabricating a semiconductor device executes a sequence of processes including a gate structure formation process (S102), ion implantation process (S104), sacrificial film formation process (S105), etching process (S112), crosslinking film formation process (S114), dielectric film formation process (S124), opening formation process (S126), and sacrificial film removal process (S128). In the sacrificial film formation process (S105), a sequence of processes including a sacrificial film coating process (S106), cure process (S108), and polishing process (S110) is executed as internal processes.

Figure 2A:
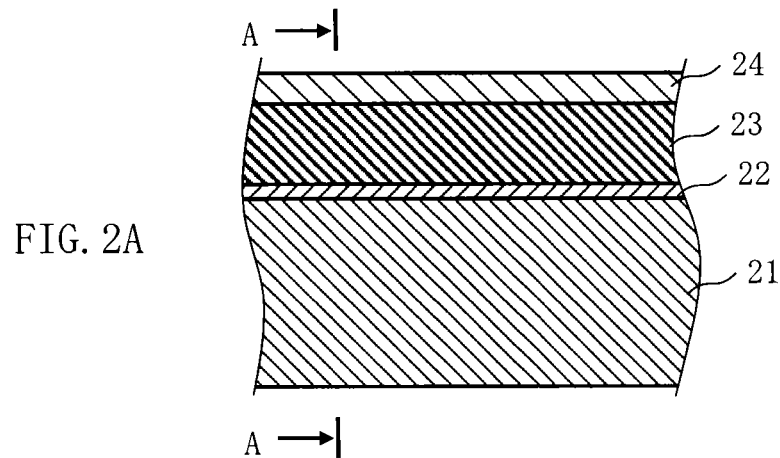
FIGS. 2A to 2C are process sectional views of the method for fabricating a semiconductor device according to the first embodiment.
Figure 2B:
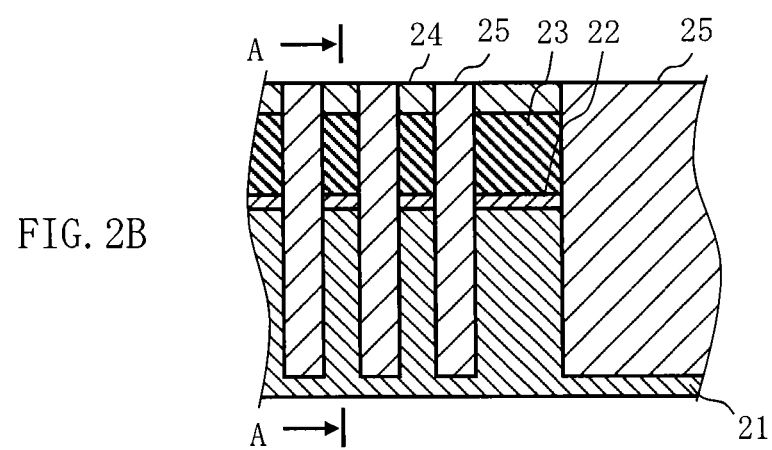
Figure 2C:
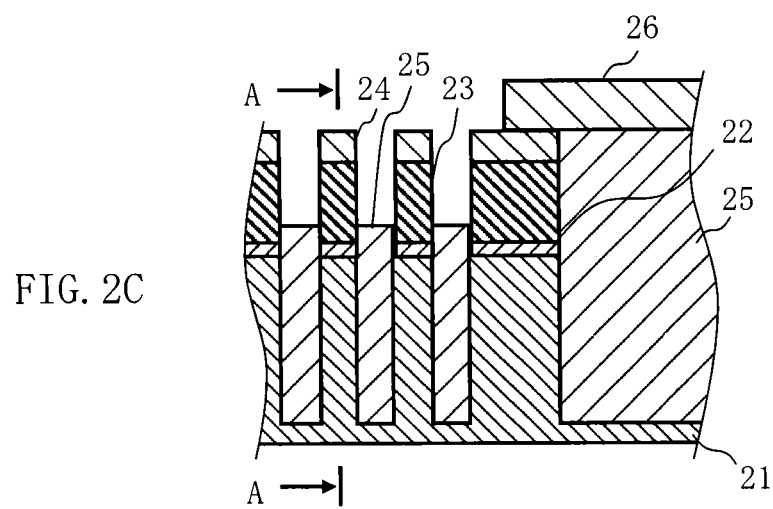
Figure 3A:
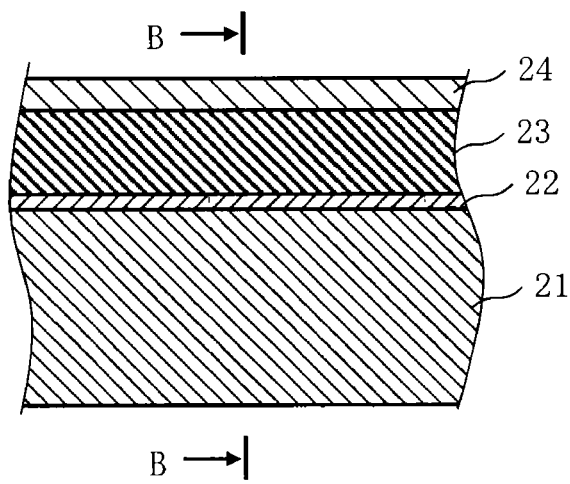
FIGS. 3A to 3C are process sectional views of the method for fabricating a semiconductor device according to the first embodiment.
Figure 3B:
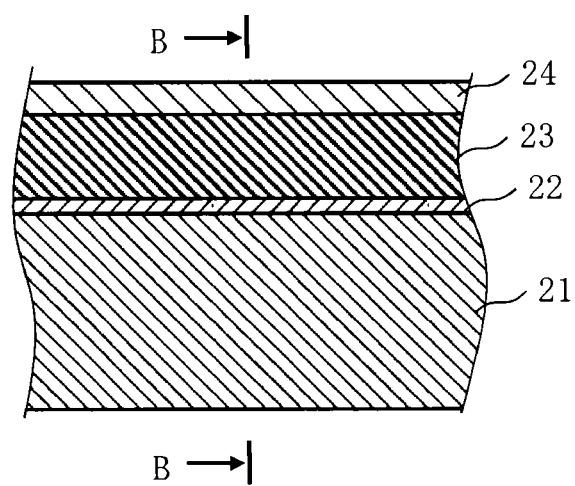
Figure 3C:
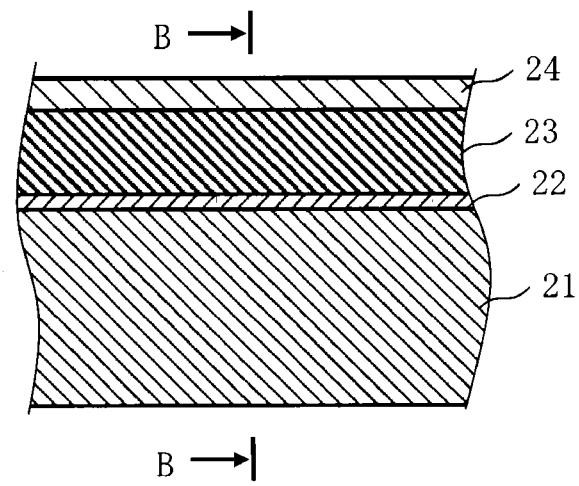

Process sectional views of the method for fabricating a semiconductor device according to the first embodiment are shown in FIGS. 2A to 2C and FIGS. 3A to 3C. In the FIGS. 2A to 2C and FIGS. 3A to 3C, the first half portion of the gate structure formation process (S102) in FIG. 1 is shown. Subsequent processes will be described later. FIGS. 2A to 2C show a cross section in a direction (B arrow) along a longitudinal direction of a control gate (CG) (word line). FIGS. 3A to 3C show a cross section in a direction (A arrow) along a direction perpendicular to the longitudinal direction of the control gate (CG) (word line). FIG. 2A and FIG. 3A correspond to the same process section, FIG. 2B and FIG. 3B correspond to the same process section, and FIG. 2C and FIG. 3C correspond to the same process section.

In the gate structure formation process (S102), a sequence of processes including a tunnel dielectric film formation process, floating gate (FG) film formation process, silicon nitride (SiN film) formation process, device isolation opening formation process, dielectric film formation process, planarization process, dielectric film delving process, etching process, IPD (Inter-poly Dielectric) film formation process, CG film formation process, cap film formation process, and gate pattern opening formation process is executed as internal processes. In the CG film formation process, a sequence of processes including a polysilicon film formation process, opening formation process of a select gate portion, and tungsten (W) film formation process is executed as internal processes.

In FIG. 2A and FIG. 3A, as the tunnel dielectric film formation process, a dielectric film 22 is formed on a semiconductor substrate 21 to a thickness of, for example, 2 to 20 nm. The dielectric film 22 functions as a tunnel dielectric film. The dielectric film is suitably formed by, for example, heat treatment (thermal oxidation treatment) in an atmosphere of oxygen as the formation method. For example, a silicon oxide (SiO2) film is used as the dielectric film 22. As the semiconductor substrate 21, for example, a p-type silicon substrate made of a silicon wafer of 300 mm in diameter is used.

Next, as the floating gate (FG) film formation process, a polysilicon film 23 is formed on the dielectric film 22 by using, for example, the CVD method to a thickness of, for example, 90 nm or less. The polysilicon film 23 functions as a charge storage layer (FG: floating gate).

As the SiN film formation process, a silicon nitride (SiN) film 24 is formed on the polysilicon film 23 by using, for example, the CVD method to a thickness of, for example, 30 nm. The SiN film 24 functions as a CMP (chemical mechanical polishing) stopper in the planarization process described later or a mask material of RIE (reactive ion etching) as an example of the delving process.

In FIG. 2B and FIG. 3B, as the device isolation opening formation process, an opening in a groove shape is first formed from the SiN film 24 up to halfway through the semiconductor substrate 21. For example, the opening of 20 nm or less in width is formed at intervals of 40 nm or less in pitch. Though not described in detail, an opening can be formed substantially perpendicularly with respect to the surface of the semiconductor device 21 by removing the exposed SiN film 24 and the polysilicon film 23, the dielectric film 22, and the semiconductor substrate 21 positioned in lower layers of a mask film by the anisotropic etching after the mask film is formed on the SiN film 24 through an oxide film by undergoing processing technology of the sidewall pattern transfer. As an example, the opening may be formed by, for example, the reactive ion etching (RIE) method.

Then, as the dielectric film formation process, a dielectric film 25 is formed in the opening and on the oxide film on the SiN film 24 as if to fill up the opening. Then, as the planarization process, the SiN film 24 is used as a CMP stopper to remove by polishing the dielectric film 25 protruding from the opening and the oxide film and the dielectric film 25 on the SiN film 24 by the CMP method for planarization. Accordingly, as shown in FIG. 2B, device isolation between memory cells is achieved. For example, a SiO2 film is used as the dielectric film 25.

In FIG. 2C and FIG. 3C, as the dielectric film delving process, the surface of the dielectric film 25 for device isolation in the memory cell formation region is delved by using RIE technique or the like to expose the side surface of the polysilicon film 23 (floating gate). The SiN film 24 serves as a mask material when the dielectric film is delved by the RIE technique. After delving up to a predetermined depth within the range in which the mask function can be maintained, the SiN film 24 is removed by hot phosphoric acid or the like. In a region outside the memory cell formation region, a resist film 26 is formed and left behind so that the dielectric film 25 for device isolation is not etched. Then, the dielectric film is further delved up to a predetermined depth by using wet etching, chemical dry etching (CDE) or the like.

Figure 4A:
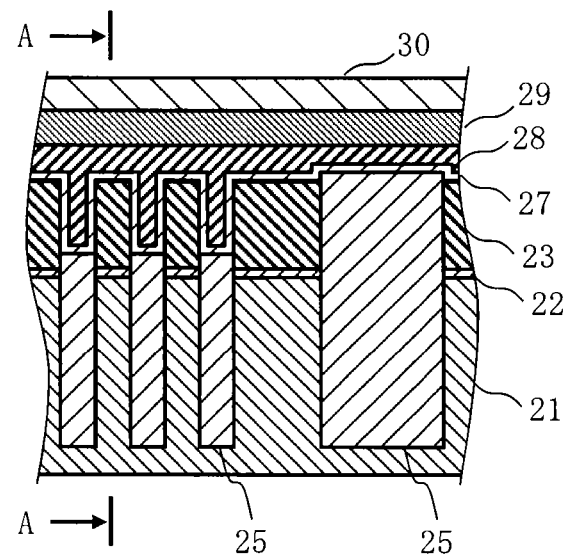
FIGS. 4A and 4B are process sectional views of the method for fabricating a semiconductor device according to the first embodiment.
Figure 4B:
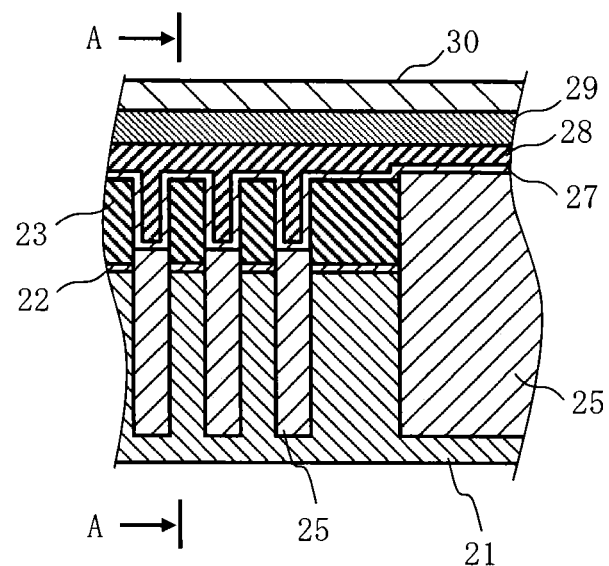
Figure 5A:
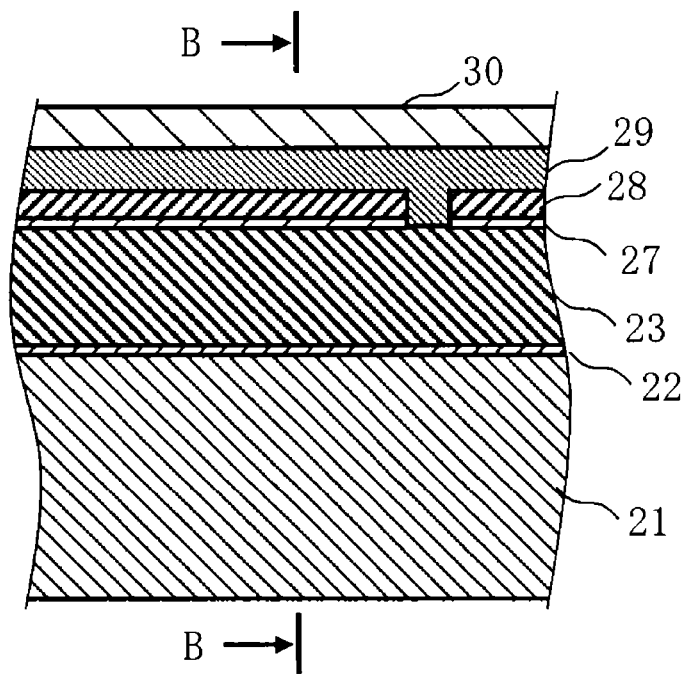
FIGS. 5A and 5B are process sectional views of the method for fabricating a semiconductor device according to the first embodiment.
Figure 5B:
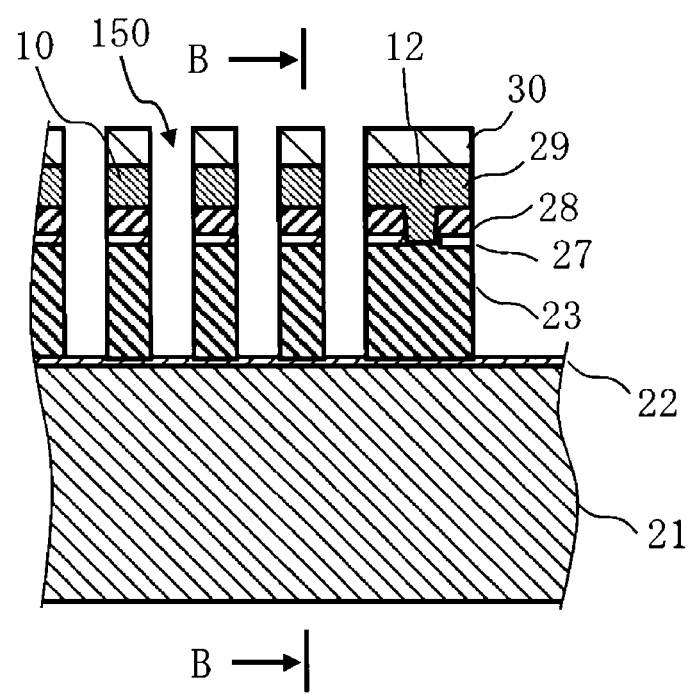

Process sectional views of the method for fabricating a semiconductor device according to the first embodiment are shown in FIGS. 4A and 4B and FIGS. 5A and 5B. In FIGS. 4A and 4B and FIGS. 5A and 5B, the latter half portion of the gate structure formation process (S102) in FIG. 1 is shown. Subsequent processes will be described later. FIGS. 4A and 4B show a cross section in a direction (B arrow) along the longitudinal direction of the control gate (CG) (word line). FIGS. 5A and 5B show a cross section in a direction (A arrow) along the direction perpendicular to the longitudinal direction of the control gate (CG) (word line). FIG. 4A and FIG. 5A correspond to the same process section and FIG. 4B and FIG. 5B correspond to the same process section.

In FIG. 4A and FIG. 5A, as the etching process, the remaining resist film 26 is first ashed and removed. Then, as the IPD film formation process, a dielectric film 27 (IPD film) is formed on the polysilicon film 23, on the side wall of the polysilicon film 23 as a result of delving the dielectric film 25 and on the dielectric film 25 by using, for example, the CVD method to a thickness of, for example, 15 nm or less. The dielectric film 27 functions as an inter-electrode dielectric film.

Subsequently, as the polysilicon film formation process of the control gate (CG) film formation process, a polysilicon film 28 is formed on the IPD dielectric film 27 by using, for example, the CVD method to a thickness of, for example, 50 nm or less. The polysilicon film 28 functions as a portion of the control gate (CG). Then, as the opening formation process of the select gate portion, an opening is formed in the polysilicon film 28 and the IPD dielectric film 27 in a select gate electrode portion and peripheral transistor gate electrode portion (not shown) by using photolithography technology, RIE technique and the like. Then, as the tungsten (W) film formation process, a W film 29 is formed on the polysilion film 28 in which the opening is formed by using, for example, the CVD method to a thickness of, for example, 30 nm or less. The W film 29 functions as a remaining portion of the control gate (CG). That is, the control gate has a laminated structure in which the polysilicon film 28 and the W film 29 are laminated. The laminated film of the polysilicon film 28 and the W film 29 functions as a word line in a memory device.

The laminated film of the polysilicon film 28 and the W film 29 is used here as the control gate, but the laminated film is not limited to this example. Instead of the W film 29, a laminated film of the W film and a tungsten nitride (WN) may be used. Alternatively, the W film 29 alone or a laminated film of the W film and tungsten nitride (WN) may be used as the control gate without using the polysilicon film 28. Alternatively, a laminated film of the W film 29 and another conductive film may be used as the control gate.

As the cap film formation process, a cap film 30 is formed on the W film 29 by using, for example, the CVD method to a thickness of, for example, 20 nm or less. An SiN film or the like is suitable as the cap film 30.

In FIG. 4B and FIG. 5B, as the gate pattern opening formation process, an opening 150 in a groove structure is formed in a gate structure portion by the lithography process and dry etching process (not shown) inside the cap film 30, the W film 29, the polysilicon film 28, the IPD dielectric film 27, and the polysilicon film 23. For example, the opening 150 of 20 nm or less in width is formed at intervals of 40 nm or less in pitch. As a result, a gate pattern of 1:1 in which width dimensions of a gate structure 10 portion and the opening 150 are each, for example, 20 nm can be formed. The opening 150 can be formed substantially perpendicularly with respect to the surface of the semiconductor substrate 21 by removing the exposed cap film 30 and the W film 29, the polysilicon film 28, the IPD dielectric film 27, and the polysilicon film 23 positioned in lower layers of a mask film by the anisotropic etching from the semiconductor substrate 21 having the mask film formed on the cap film 30 by undergoing processing technology of the sidewall pattern transfer (not shown). As an example, the opening 150 may be formed by, for example, the reactive ion etching method. In other words, the opening 150 cutting through the cap film 30, the W film 29, the polysilicon film 28, the IPD dielectric film 27, and the polysilicon film 23 is formed by etching in such a way that the cap film 30, the W film 29, the polysilicon film 28, the IPD dielectric film 27, and the polysilicon film 23 remain (are present) in the gate region.

Accordingly, each laminated film of the W film 29, the polysilicon film 28, the IPD dielectric film 27, and the polysilicon film 23 arranged in the longitudinal direction (first direction) of the device isolation (STI: Shallow Trench Isolation structure) region via the opening 150 becomes the gate structure 10 of each cell of a NAND flash memory device. On the other hand, the control gate made of a laminated film of the polysilicon film 28 and the W film 29 is shared by the gate structures 10 arranged in the longitudinal direction (second direction) of the control gate (CG) (word line) and functions as a word line of the NAND flash memory device. A select gate structure 12 is formed at an edge of a plurality of gate structure 10 portions arranged in the longitudinal direction of the device isolation (STI structure) region. First, the gate structure formation process (S102) in FIG. 1 is executed as described above.

Figure 6A:
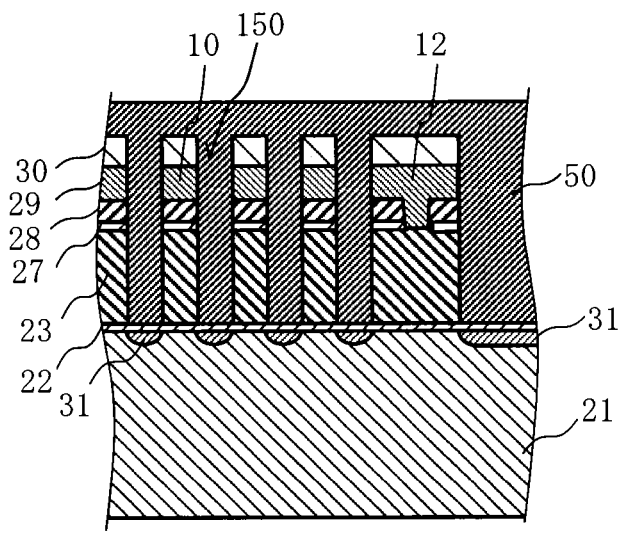
FIGS. 6A to 6C are process sectional views of the method for fabricating a semiconductor device according to the first embodiment.
Figure 6B:
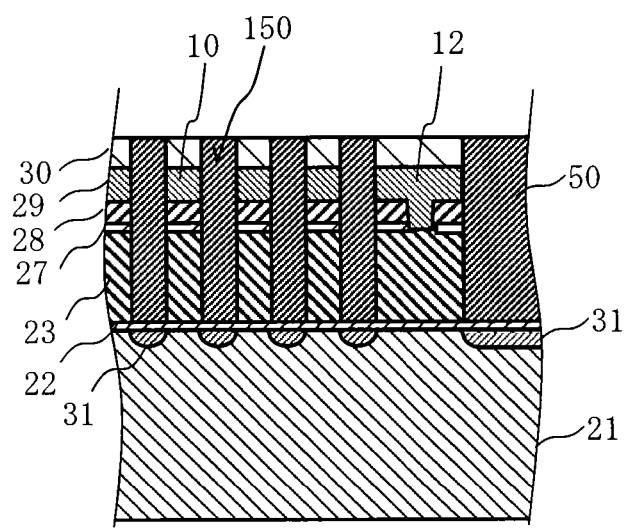
Figure 6C:
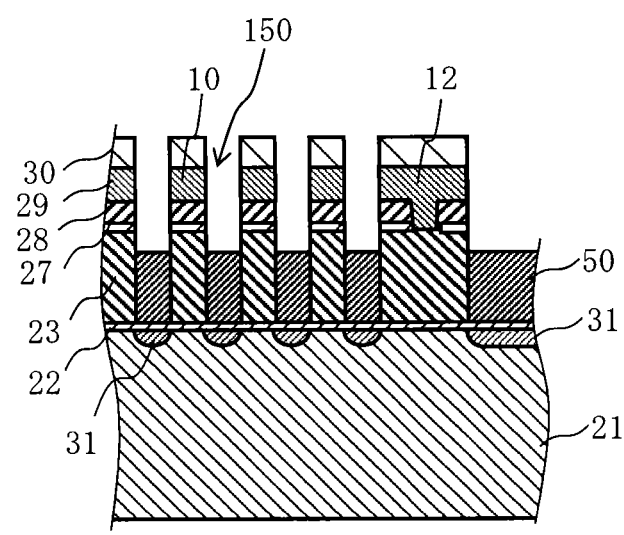

Process sectional views of the method for fabricating a semiconductor device according to the first embodiment are shown in FIGS. 6A to 6C. FIGS. 6A to 6C show the ion implantation process (S104) to the etching process (S112) in FIG. 1. Subsequent processes will be described later. FIGS. 6A to 6C show a cross section in a direction (A arrow like in FIG. 3A to FIG. 3C and FIG. 5A and FIG. 5B) along a direction perpendicular to the longitudinal direction of the control gate (CG) (word line). Hereinafter, the illustration of a cross section in a direction (B arrow) along the longitudinal direction of the control gate (CG) (word line) is omitted.

In FIG. 6A, as the ion implantation process (S104), an n-type semiconductor region 31 is formed in regions on both sides of the gate structure 10 and select gate structure 12 portion and on the surface of the p-type semiconductor substrate 21 by ion implantation of an n-type impurity. The n-type semiconductor region 31 functions as a source/drain region (S/D). A p-type semiconductor region sandwiched between the n-type semiconductor regions 31 functions as a channel region in which a gate region (G) is formed in an upper portion thereof. Thus, the region at the bottom of the opening 150 where the dielectric film 22 is exposed becomes a source region or drain region. Here, a NAND string structure in which a plurality of cells (gate structures 10) in which a source portion of one cell of adjacent cells and a drain portion of the other cell are shared is formed.

Subsequently, as the sacrificial film coating process (S106), the inner side of the opening 150 and the gate structure 10 and select gate structure 12 are coated with a sacrificial film 50 that will have the thickness of, for example, 450 nm after being cured by using the coating process. For example, a carbon (C) film is suitable as the sacrificial film 50. Then, as the cure process (S108), the sacrificial film 50 as a coating film is thermally treated at, for example, 200° C.

In FIG. 6B, as the polishing process (S110), the sacrificial film 50 protruding from the opening 150 between the gate structures 10 is removed by polishing by using the CMP method. In other words, the sacrificial film 50 is removed by polishing up to the height position of the plurality of the gate structures 10.

In FIG. 6C, as the etching process (S112), the sacrificial film 50 is removed up to a position below the upper surface (semiconductor substrate side) of the polysilicon film 23 to be a floating gate portion in the both gate structures 10 adjacent to each other by etchback. The sacrificial film 50 is formed up to an intermediate height position between the gate structures 10 formed on the semiconductor device 21. In other words, the sacrificial film 50 is etched up to an intermediate height position between the plurality of the gate structures 10, for example, up to a position where the upper surface of the sacrificial film 50 becomes below the upper surface of the floating gate portion between the plurality of the gate structures 10.

If a coating carbon film with low forming viscosity is used, the sacrificial film may be coated in the sacrificial film coating process (S106) up to a position below the upper surface of the polysilicon film 23 to be the floating gate portion in the both gate structures 10 adjacent to each other. Accordingly, the polishing process (S110) and the etching process (S112) can be omitted.

Figure 7A:
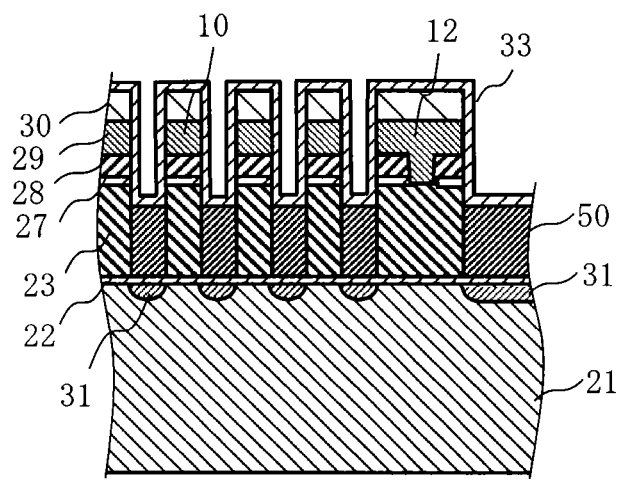
FIGS. 7A and 7B are process sectional views of the method for fabricating a semiconductor device according to the first embodiment.
Figure 7B:
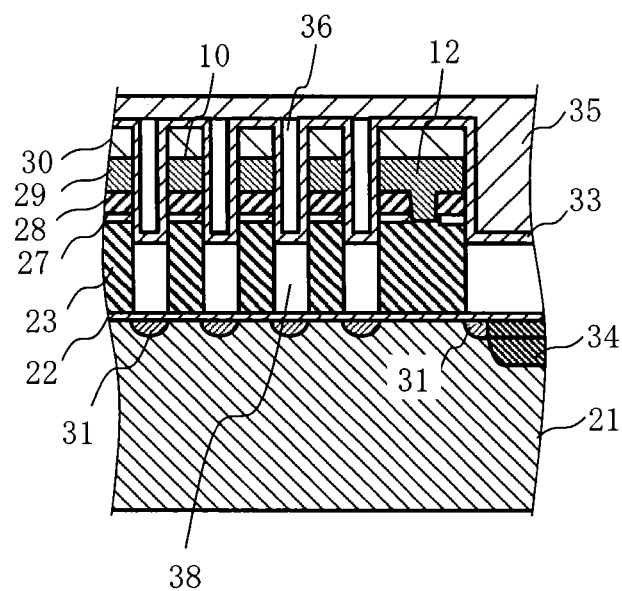

Process sectional views of the method for fabricating a semiconductor device according to the first embodiment are shown in FIGS. 7A and 7B. FIGS. 7A and 7B show the crosslinking film formation process (S114) to the sacrificial film removal process (S128). FIGS. 7A and 7B show a cross section in a direction (A arrow like in FIG. 3A to FIG. 3C and FIG. 5A and FIG. 5B) along a direction perpendicular to the longitudinal direction of the control gate (CG) (word line).

In FIG. 7A, as the crosslinking film formation process (S114), a crosslinking film 33 (first dielectric film) is conformally formed on the sacrificial film 50 and also on the gate structure 10 and the select gate structure 12 to a thickness of, for example, less than 10 nm. A silicon oxide (SiO2 film) is suitable as the crosslinking film 33. The formation method such as LPCVD having deposition properties of excellent step coverage can be used. Accordingly, the adjacent gate structures 10 can be crosslinked by the crosslinking film 33. Thus, in the first embodiment, the crosslinking film 33 covers a portion of an upper portion and above of the floating gate portion of the plurality of the gate structures 10. In other words, the sidewall and the upper surface of the control gate are covered with the crosslinking film 33 in the first embodiment.

In FIG. 7B, as the dielectric film formation process (S124), a dielectric film 35 (second dielectric film) is formed on the gate structure 10 and the select gate structure 12 on which the crosslinking film 33 is formed in such a way that a cavity 36 is left between the adjacent gate structures 10 on the crosslinking film 33. An SiO2 film is suitable as the dielectric film 35. The formation method such as plasma CVD with poor step coverage can be used. In other words, the dielectric film 35 is formed so as to cover the cavity 36 above the crosslinking film 33 between the adjacent gate structures 10. In the first embodiment, the cavity 36 above the crosslinking film 33 is enclosed with the crosslinking film 33 and the dielectric film 35.

Then, as the opening formation process (S126), an opening is formed in a region other than an effective region where the gate structure 10 and the select gate structure 12 are arranged.

Figure 8:
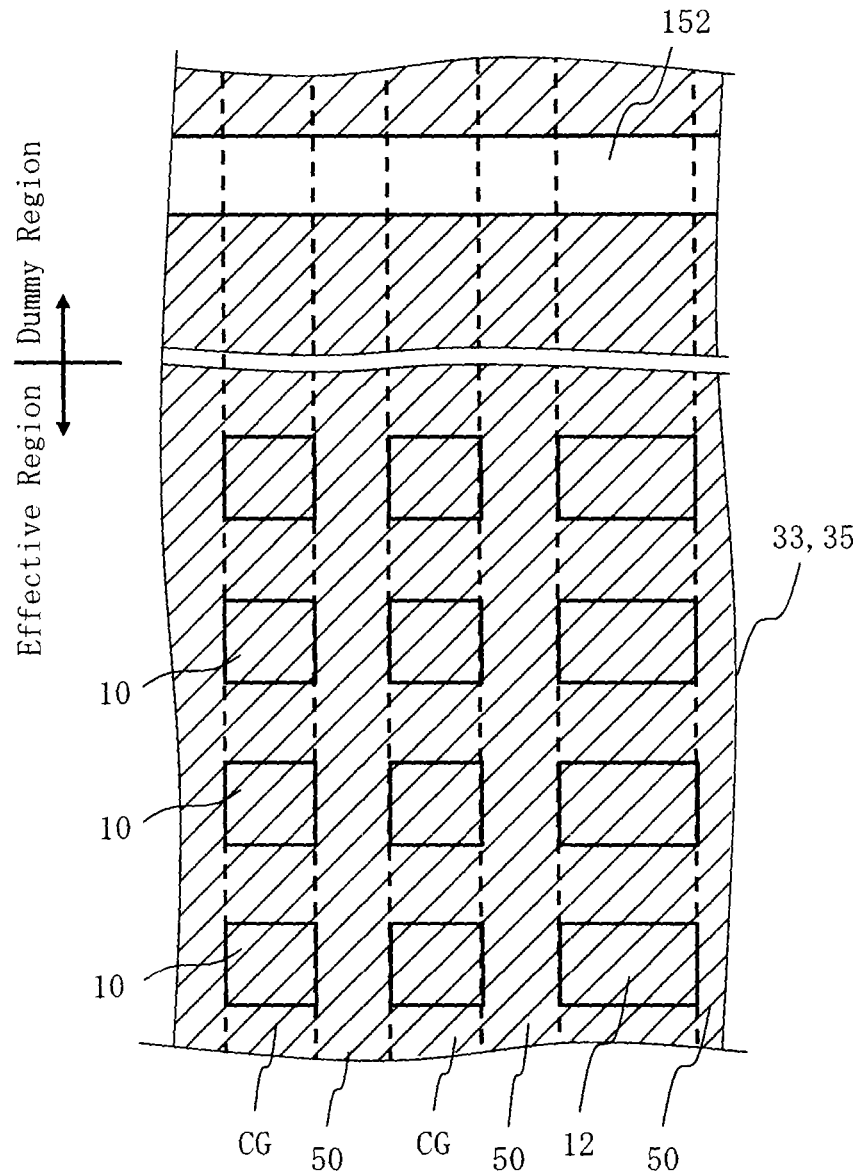
FIG. 8 is a top view illustrating an opening position of an opening according to the first embodiment.

A top view illustrating an opening position of an opening according to the first embodiment is shown in FIG. 8. In FIG. 8, an opening 152 is formed in a dummy region positioned extending in the longitudinal direction from the control gate (CG) (word line) in the effective region where memory cells are arranged. The opening 152 can be formed in a dummy region other than a cell operation region (the effective region where a cell array is arranged), suitably for example, a leading region of the control gate (CG) (word line). The dummy region is generally arranged about 1 μm away from a leading electrode. The opening depth of the opening 152 is deeper than at least the IPD dielectric film 27 and the crosslinking film 33 and the dielectric film 35 are removed by etching until the sacrificial film 50 is reached. The opening 152 may be formed in each space between the gate structures 10 or, as shown in FIG. 8, may suitably be formed long in a direction perpendicular to the longitudinal direction of the control gate (CG) (word line) so as to be able to be in contact with a plurality of the sacrificial films 50 formed in each space between the gate structures 10.

Then, as the sacrificial film removal process (S128), the sacrificial film 50 formed between the gate structures 10 is removed through the opening. The sacrificial film 50 may first be ashed and then removed by wet cleaning. With the above process, a cavity 38 can be formed below (semiconductor device side) the crosslinking film 33 in each space between the gate structures 10. Accordingly, the lower sidewall of the floating gate portion is exposed to the cavity 38 below the crosslinking film 33.

Furthermore, in FIG. 7B, after the crosslinking film formation process (S114) shown in FIG. 7A, the opening formation process (S126) and the sacrificial film removal process (S128) described above may be executed before the dielectric film formation process (S124).

Then, an n+ type semiconductor region 34 is further formed by ion implantation of a high-concentration n− type impurity such as arsenic and phosphor on the surface of the semiconductor substrate 21 on the opposite side of the gate structure 10 side of the select gate structure 10.

According to the first embodiment, as described above, the adjacent gate structures 10 are crosslinked by the crosslinking film 33 so that the cavities 36, 38 are each formed above and below in a position between the adjacent gate structures 10 of the plurality of the gate structures 12.

Figure 9A:
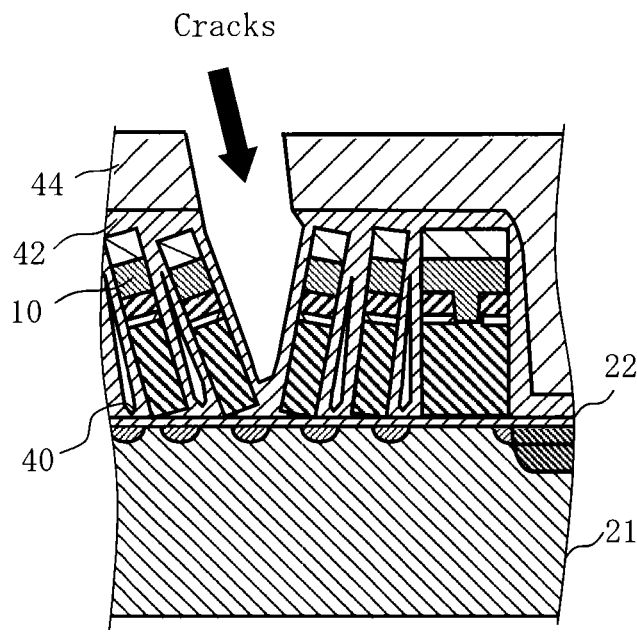
FIGS. 9A to 9C are conceptual diagrams comparing mechanical strength of a gate structure depending on the presence of a crosslinking film according to the first embodiment.
Figure 9B:
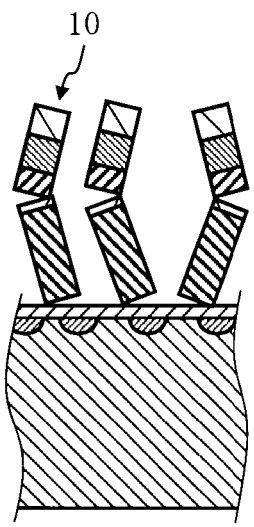
Figure 9C:
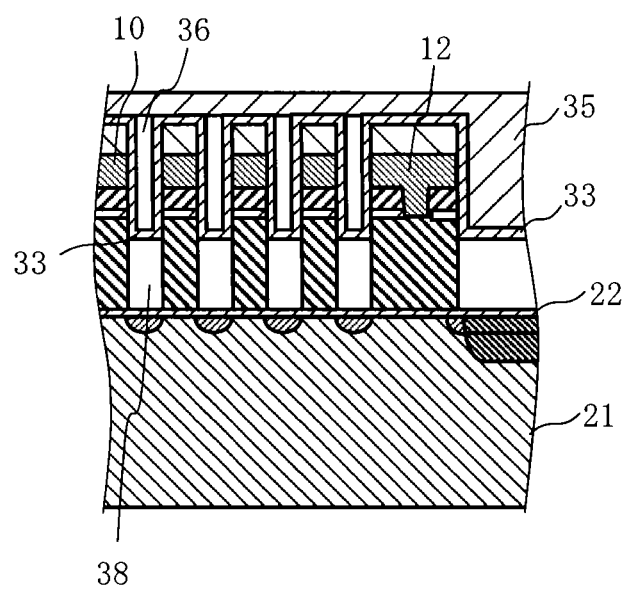

Conceptual diagrams comparing mechanical strength of a gate structure depending on the presence of a crosslinking film according to the first embodiment are shown in FIGS. 9A to 9C. If a space between the gate structures 10 is formed by one cavity 40 without arranging the crosslinking film 33 according to the first embodiment, when dielectric films 42, 44 are formed on the gate structure 10 and the surface thereof is polished by, for example, chemical mechanical polishing (CMP), as shown in FIG. 9A, the gate structure 10 may topple, creating cracks in the dielectric films 42, 44. As shown in FIG. 9B, the gate structure 10 itself may collapse. In contrast, if the crosslinking film 33 according to the first embodiment is arranged, the mechanical strength of the gate structure 10 and the select gate structure 12 can be improved. As a result, if, for example, the surface is polished by using CMP or the like, the occurrence of cracks in the dielectric film 35 and the collapse of the gate structure 10 itself can be inhibited.

In the first embodiment, the bottom of the crosslinking film 33 is suitably formed so as to be below the upper surface of the polysilicon film 23 to be the floating gate portion in the both gate structures 10 to be crosslinked and adjacent to each other. By forming the crosslinking film 33 in such a position, at least toppling or the collapse of the floating gate portion can be inhibited. Preferably, it is more suitable to form the crosslinking film 33 in such a way that the upper surface thereof is formed above (CG side) the bottom of the IPD dielectric film 27. Accordingly, peeling of the IPD dielectric film 27 can also be prevented at the same time. Further, it is still more suitable to form the crosslinking film 33 in such a way that the upper surface thereof is formed below (FG side) the lower surface of the polysilicon film 28. Accordingly, interference between CGs can be prevented at the same time.

Also as shown in FIG. 8, the sacrificial films 50 are formed in substantially the same height positions by extending along the longitudinal direction of the control gate (CG) (word line). Thus, the crosslinking films 33 formed on the sacrificial films 50 are also formed in substantially the same height positions by extending along the longitudinal direction of the control gate (CG) (word line). In other words, the crosslinking film 33 can successively be formed in a suitable height position along the gate structures 10 arranged in the longitudinal direction of the control gate.

Second Embodiment

In the first embodiment, an LPCVD film is conformally formed as the crosslinking film 33, but the crosslinking film 33 is not limited to such an example. In the second embodiment, a case when another crosslinking film is formed will be described.

Figure 10:
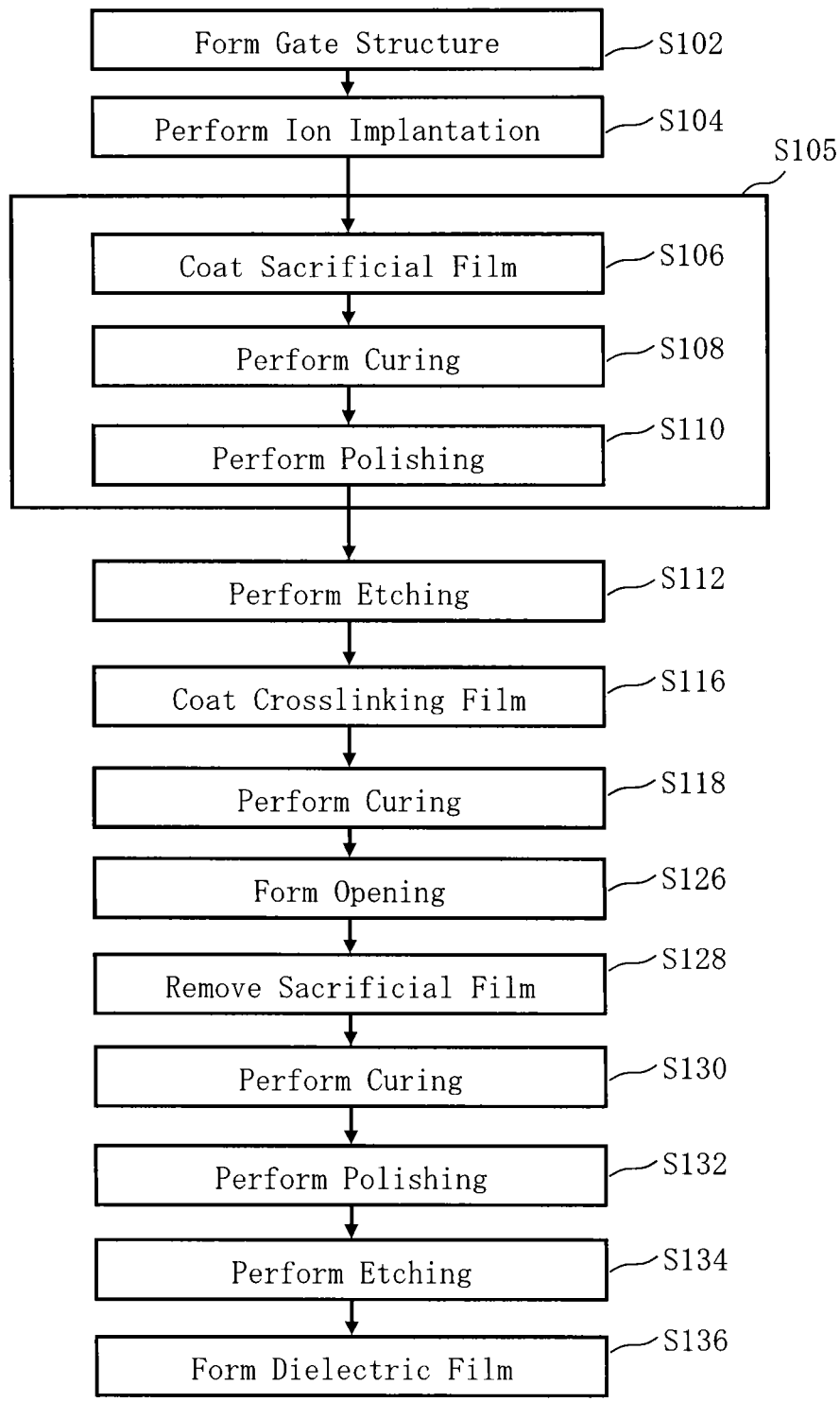
FIG. 10 is a flow chart showing principal processes of the method for fabricating a semiconductor device according to a second embodiment.

FIG. 10 is a flow chart showing principal processes of the method for fabricating a semiconductor device according to the second embodiment. FIG. 10 is the same as FIG. 1 except that a crosslinking film coating process (S116) and cure process (S118) are added in place of the crosslinking film formation process (S114) and the dielectric film formation process (S124) and a cure process (S130), polishing process (S132), etching process (S134), and dielectric film formation process (S136) are added after the sacrificial film removal process (S128). Content not specifically described below is the same as in the first embodiment. Each process from the gate structure formation process (S102) to the etching process (S112) is the same as in the first embodiment.

Figure 11A:
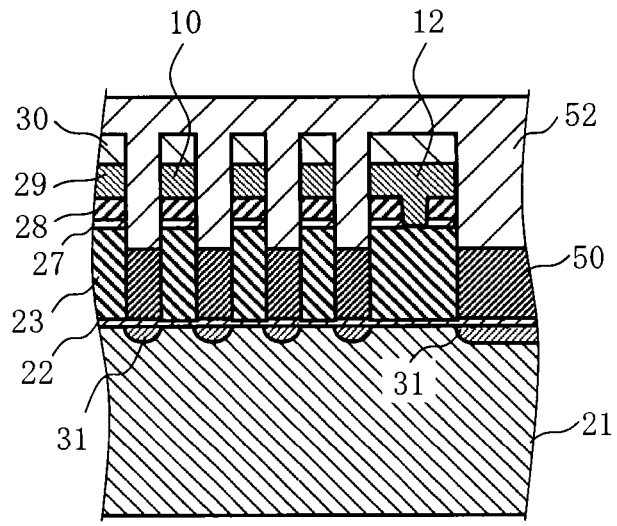
FIGS. 11A to 11C are process sectional views of the method for fabricating a semiconductor device according to the second embodiment.
Figure 11B:
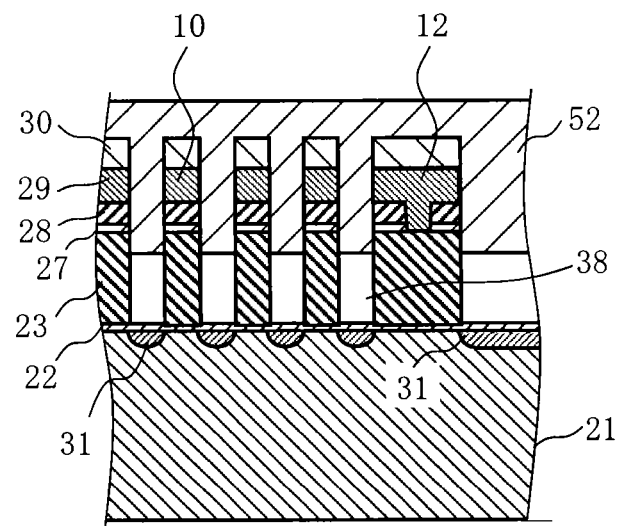
Figure 11C:
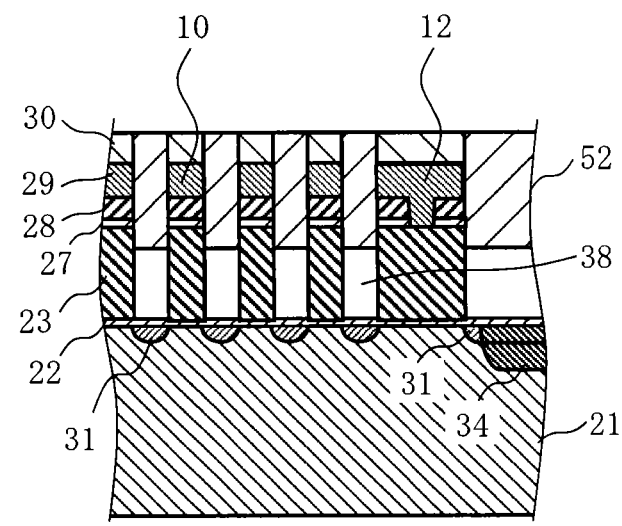

Process sectional views of the method for fabricating a semiconductor device according to the second embodiment are shown in FIGS. 11A to 11C. In FIGS. 11A to 11C shows the crosslinking film coating process (S116) to the polishing process (S132) in FIG. 10. Subsequent processes will be described later. FIGS. 11A to 11C show a cross section in a direction (A arrow like in FIG. 3A to FIG. 3C and FIG. 5A and FIG. 5B) along a direction perpendicular to the longitudinal direction of the control gate (CG) (word line).

In FIG. 11A, as the crosslinking film coating process (S116), the sacrificial film 50 inside the opening between the gate structures 10, the gate structure 10 and the select gate structure 12 are coated with a crosslinking film 52 by using the coating process to a thickness of, for example, 450 nm after being cured. For example, a PSZ (perhydrosilazane polymer: polysilazane) film is suitable as the crosslinking film 52. Then, as the cure process (S118), the crosslinking film 52 as a coating film is thermally treated at, for example, 150° C. for 2 min. Further, the crosslinking film 52 is oxidized by steam at about, for example, 200 to 250° C.

In FIG. 11B, as the opening formation process (S126), an opening is formed in a region other than the effective region where the gate structure 10 and the select gate structure 12 are arranged. Content of the opening formation process (S126) may be same as in the first embodiment.

Then, as the sacrificial film removal process (S128), the sacrificial film 50 formed between the gate structures 10 is removed through the opening. Content of the sacrificial film removal process (S128) may be same as in the first embodiment. With the above process, the cavity 38 can be formed below (semiconductor substrate side) the crosslinking film 52. Impurities (such as carbon) contained in a solvent have been eliminated from the PSZ film to be the crosslinking film 52 by steam oxidation and thus, such impurities can be prevented from dissolving in a cleaning liquid during wet cleaning.

Then, as the cure process (S130), the crosslinking film 52 is further oxidized by steam at about, for example, 550° C. Accordingly, almost all content impurities such as nitrogen (N) and carbon (C) are eliminated so that a PSZ film with excellent insulating properties can be obtained. After the steam oxidation at about 550° C., for example, the crosslinking film 52 may further be treated for densification in an atmosphere of, for example, nitrogen at 850° C. for 30 min. Accordingly, mechanical strength (resistance) of the crosslinking film 52 can further be increased.

In FIG. 11C, as the polishing process (S132), the crosslinking film 52 protruding from the opening between the gate structures 10 is removed by polishing by using the CMP method.

Figure 12A:
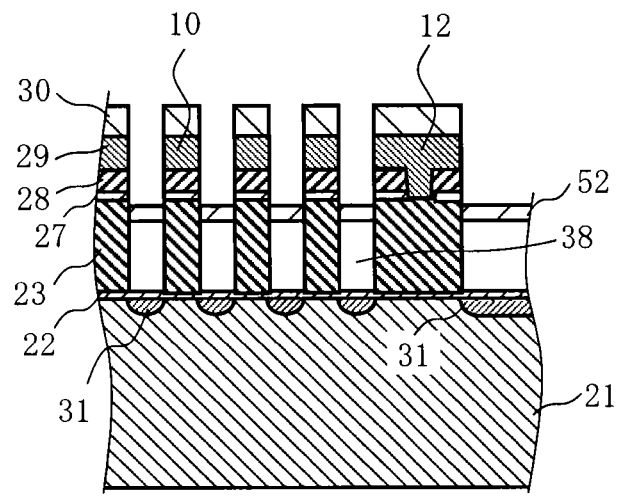
FIGS. 12A and 12B are process sectional views of the method for fabricating a semiconductor device according to the second embodiment.
Figure 12B:
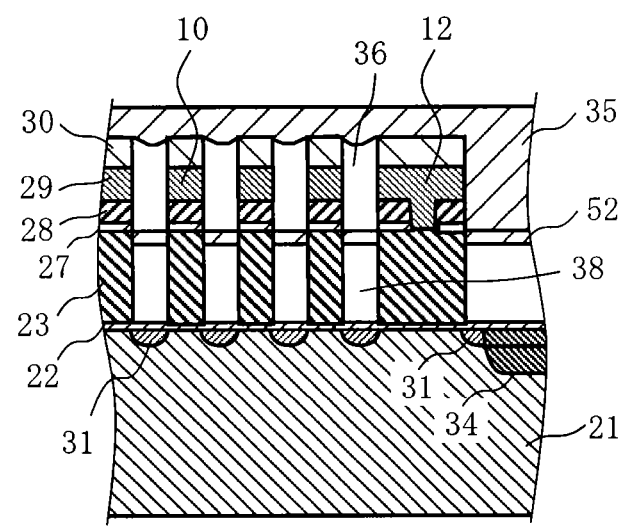

Process sectional views of the method for fabricating a semiconductor device according to the second embodiment are shown in FIGS. 12A and 12B. FIGS. 12A and 12B show the etching process (S134) and the dielectric film formation process (S136) in FIG. 10. FIGS. 12A and 12B show a cross section in a direction (A arrow like in FIG. 3A to FIG. 3C and FIG. 5A and FIG. 5B) along a direction perpendicular to the longitudinal direction of the control gate (CG) (word line).

In FIG. 12A, as the etching process (S134), the crosslinking film 52 (example of the first dielectric film) is removed by etchback between the adjacent gate structures 10 until the crosslinking film 52 is etched to a thickness of, for example, 10 nm. In other words, after the sacrificial film 50 is removed, the crosslinking film 52 is etched up to an intermediate height position between the plurality of the gate structures 10.

In FIG. 12B, as the dielectric film formation process (S136), the dielectric film 35 (second dielectric film) is formed on the gate structure 10 and the select gate structure 12 on which the crosslinking film 52 is formed in such a way that the cavity 36 is left between the adjacent gate structures 10 on the crosslinking film 52. An SiO2 film is suitable as the dielectric film 35. The deposition method such as plasma CVD with poor step coverage can be used. In other words, the dielectric film 35 is formed so as to cover the cavity 36 above the crosslinking film 52 between the adjacent gate structures 10.

From the foregoing, the adjacent gate structures 10 are crosslinked by the crosslinking film 52 so that the cavities 36, 38 are each formed above and below in a position between the adjacent gate structures 10 of the plurality of the gate structures 10. When viewed from the longitudinal direction of the control gate, the crosslinking film 52 is formed for each space between the adjacent gate structures 10. The height position of the crosslinking film 52 is suitably formed just as in the first embodiment. Accordingly, in the second embodiment, the sidewall of the control gate is exposed to the cavity 36 above the crosslinking film 52.

Third Embodiment

In the first embodiment, a case when the gate structure 10 is supported by the 1-layer crosslinking film 33 is described and in the second embodiment, a case when the gate structure 10 is supported by the 1-layer crosslinking film 52 is described. In the third embodiment, a case when a laminated crosslinking film is formed will be described.

Figure 13:
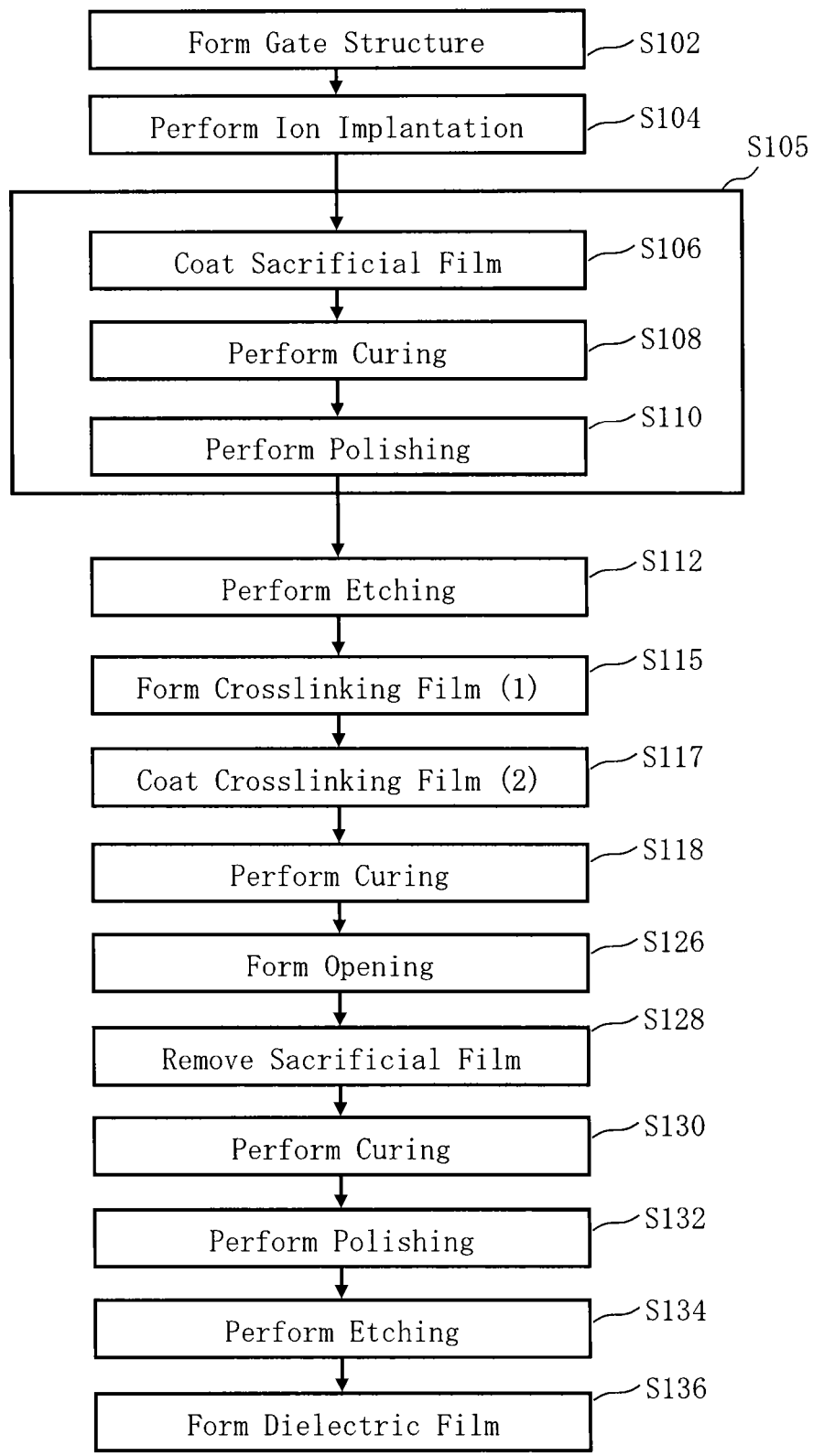
FIG. 13 is a flow chart showing principal processes of the method for fabricating a semiconductor device according to a third embodiment.

FIG. 13 is a flow chart showing principal processes of the method for fabricating a semiconductor device according to a third embodiment. FIG. 13 is the same as FIG. 10 except that a crosslinking film (1) formation process (S115) and a crosslinking film (2) coating process (S117) are added in place of the crosslinking film coating process (S116). Content not specifically described below is the same as in the second embodiment. Each process from the gate structure formation process (S102) to the etching process (S112) is the same as in the first embodiment. The crosslinking film (1) formation process (S115) is similar to the crosslinking film formation process (S114) in the first embodiment. In other words, the crosslinking film 33 becomes a crosslinking film (1) corresponding to the first layer in a laminated film.

Figure 14A:
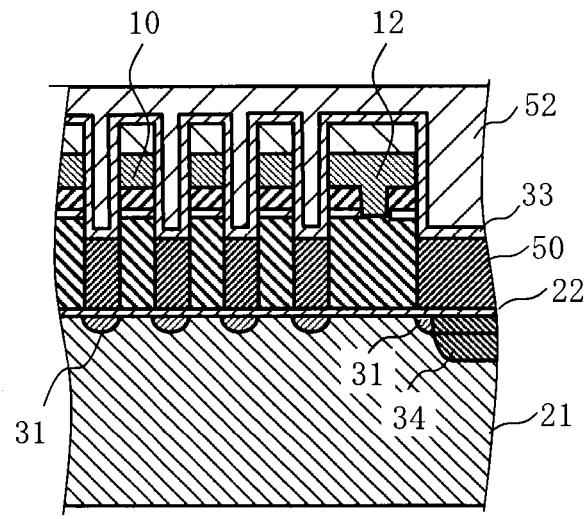
FIGS. 14A to 14C are process sectional views of the method for fabricating a semiconductor device according to the third embodiment.
Figure 14B:
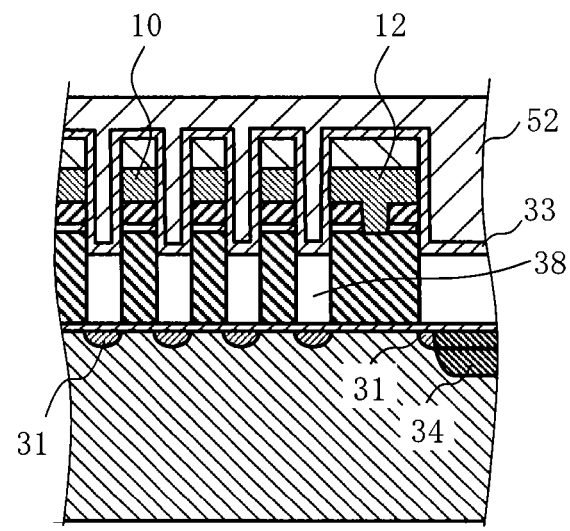
Figure 14C:
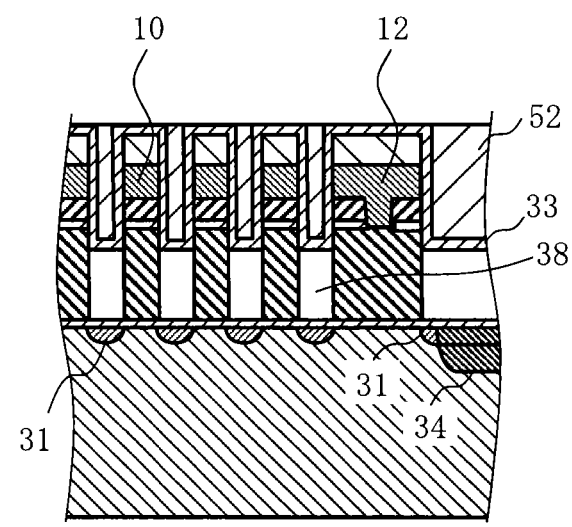

Process sectional views of the method for fabricating a semiconductor device according to the third embodiment are shown in FIGS. 14A to 14C. FIGS. 14A to 14C show the crosslinking film (2) coating process (S117) to the polishing process (S132) in FIG. 13. Subsequent processes will be described later. FIGS. 14A to 14C show a cross section in a direction (A arrow like in FIG. 3A to FIG. 3C and FIG. 5A and FIG. 5B) along a direction perpendicular to the longitudinal direction of the control gate (CG) (word line).

In FIG. 14A, as the crosslinking film (2) coating process (S117), the crosslinking film 33 inside the opening between the gate structures 10, the gate structure 10 and the select gate structure 12 are coated with the crosslinking film 52 by using the coating process to a thickness of, for example, 450 nm after being cured and as the cure process (S118), the crosslinking film 52 is oxidized by low-temperature steam at about, for example, 200° C. or lower. Other content is the same as in the second embodiment.

In FIG. 14B, as the opening formation process (S126), an opening is formed in a region other than the effective region where the gate structure 10 and the select gate structure 12 are arranged. Content of the opening formation process (S126) may be same as in the first embodiment.

Then, as the sacrificial film removal process (S128), the sacrificial film 50 formed between the gate structures 10 is removed through the opening. Content of the sacrificial film removal process (S128) may be same as in the first embodiment. With the above process, the cavity 38 can be formed below (semiconductor device side) the laminated film of the crosslinking film 33 and the crosslinking film 52. Then, like in the second embodiment, the cure process (S130) is executed.

In FIG. 14C, as the polishing process (S132), the crosslinking film 52 protruding from the opening between the gate structures 10 is removed by polishing by using the CMP method.

Figure 15A:
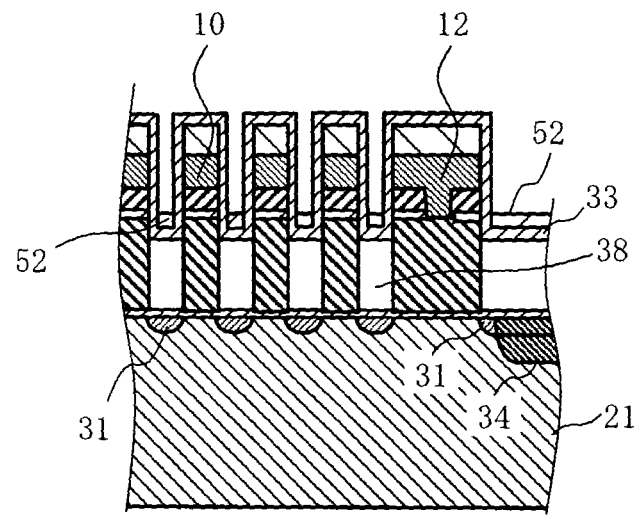
FIGS. 15A and 15B are process sectional views of the method for fabricating a semiconductor device according to the third embodiment.
Figure 15B:
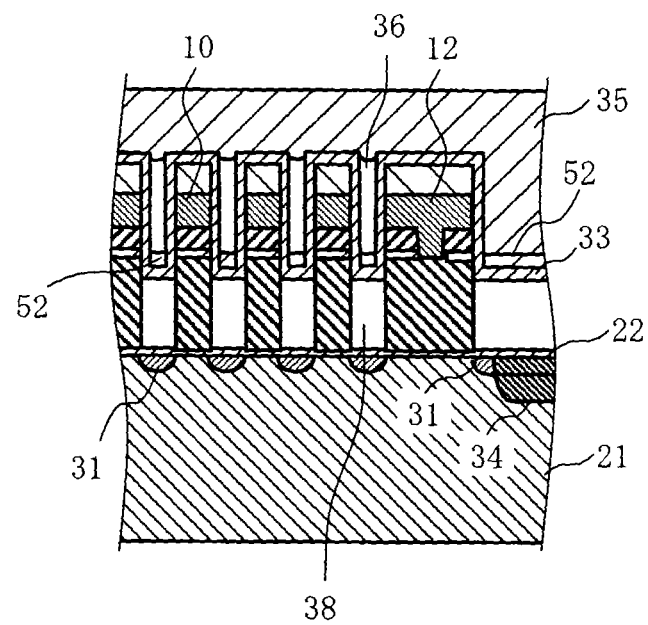

Process sectional views of the method for fabricating a semiconductor device according to the third embodiment are shown in FIGS. 15A and 15B. FIGS. 15A and 15B show the etching process (S134) and the dielectric film formation process (S136) in FIG. 13. FIGS. 15A and 15B show a cross section in a direction (A arrow like in FIG. 3A to FIG. 3C and FIG. 5A and FIG. 5B) along a direction perpendicular to the longitudinal direction of the control gate (CG) (word line).

In FIG. 15A, as the etching process (S134), the crosslinking film 52 is removed by etchback between the adjacent gate structures 10 until the crosslinking film 52 is etched to a thickness of, for example, 10 nm. Because the crosslinking film 52 is oxidized at 200° C. or lower, the etching rate of the crosslinking film 52 is 10 times faster than the densified crosslinking film 33 or more and the crosslinking film 52 can be removed with high selectivity while leaving the crosslinking film 33 in a side portion of the gate structures 10. Then, after steam oxidation at about, for example, 550° C., the crosslinking films may be treated for densification in an atmosphere of nitrogen at 850° C. for 30 min. Accordingly, a laminated film of two layers of the crosslinking film 33 and the crosslinking film 52 is formed between the adjacent gate structures 10. In other words, the crosslinking film 52 (third dielectric film) is etched up to an intermediate height position different from the height position of the sacrificial film 50 between the plurality of the gate structures 10.

In FIG. 15B, as the dielectric film formation process (S136), the dielectric film 35 (second dielectric film) is formed on the gate structure 10 and the select gate structure 12 on which the crosslinking films 33, 52 are formed in such a way that the cavity 36 is left between the adjacent gate structures 10 on the crosslinking film 52. In other words, the dielectric film 35 is formed so as to cover the cavity 36 above the crosslinking film 33 and the crosslinking film 52 between the adjacent gate structures 10.

From the foregoing, the adjacent gate structures 10 are crosslinked by the 2-layer laminated film of the crosslinking film 33 and the crosslinking film 52 (third dielectric film) so that the cavities 36, 38 are each formed above and below in a position between the adjacent gate structures 10 of the plurality of the gate structures 10. The height position of the 2-layer laminated film of the crosslinking film 33 and the crosslinking film 52 is suitably formed in the same manner as in the first embodiment. By adopting a laminated film of the crosslinking films 33, 52, mechanical strength of the crosslinking films 33, 52 can further be increased. Incidentally, the order of lamination of the crosslinking film 33 and the crosslinking film 52 may be reversed.

The embodiments are described above with reference to the concrete examples. However, the present embodiment is not limited to the concrete examples. In the examples described above, cavities are each formed above and below by one crosslinking film (or a laminated film), but the present embodiment is not limited to such examples. A plurality of steps may also be suitably formed so as to crosslink adjacent gate structures by crosslinking films in different height positions.

Concerning the thickness of each film and the size, shape, number and the like of openings, what is needed for semiconductor integrated circuits and various semiconductor elements can be selected and used as appropriate.

In addition, all methods for fabricating a semiconductor device that includes components of the present embodiment and can be obtained as modifications as appropriate by persons skilled in the art are included in the scope of the present embodiment.

While techniques normally used in the semiconductor industry such as a photolithography process and cleaning before and after treatment are not described for convenience of description, it is needless to say that such techniques are included in the scope of the present embodiment.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
a plurality of gate structures;
a first dielectric film that builds a bridge over adjacent gate structures of the plurality of gate structures so as to form a first cavity above a position between the adjacent gate structures and a second cavity below the position between the adjacent gate structures; and
a second dielectric film formed to cover the first cavity above the first dielectric film between the adjacent gate structures.

2. The device according to claim 1, wherein
the plurality of gate structures have floating gate portions respectively, and
a bottom of the first dielectric film is positioned below upper surfaces of the floating gate portions in the both adjacent gate structures.

3. The device according to claim 2, wherein the first dielectric film covers a portion of upper portions and above of the floating gate portions of the plurality of gate structures.

4. The device according to claim 1, wherein
the first dielectric film builds the bridge over the adjacent gate structures in a first direction, the plurality of gate structures have floating gate portions respectively and share control gates among gate structures arranged in a second direction crossing the first direction, and the first dielectric film is formed in a substantially same height position by extending along a longitudinal direction of the control gates.

5. The device according to claim 4, wherein lower portions of sidewalls of the floating gate portions are exposed to the cavity below the first dielectric film.

6. The device according to claim 5, wherein sidewalls of the control gates are exposed to the first cavity above the first dielectric film.

7. The device according to claim 5, wherein sidewalls of the control gates are covered with the first dielectric film.

8. The device according to claim 1, wherein the first dielectric film builds the bridge over the adjacent gate structures in a first direction, the plurality of gate structures have floating gate portions respectively and share control gates among gate structures arranged in a second direction crossing the first direction, a bottom of the first dielectric film is positioned below upper surfaces of the floating gate portions in the both adjacent gate structures, and the first dielectric film is formed in a substantially same height position by extending along a longitudinal direction of the control gates.

9. The device according to claim 8, wherein an upper surface of the first dielectric film is positioned below a lower surface of the control gates.

10. The device according to claim 1, wherein the first cavity above the first dielectric film is enclosed with the first dielectric film and the second dielectric film.

11. The device according to claim 1, further comprising: a third dielectric film formed on the first dielectric film in such a way that the cavity above the first dielectric film is left to build the bridge over the adjacent gate structures.

* * * * *